United States Patent
Winiecki

(10) Patent No.: US 9,313,055 B2
(45) Date of Patent: Apr. 12, 2016

(54) TRANSMITTER LINEARIZATION

(71) Applicant: Sequans Communications Limited, Reading (GB)

(72) Inventor: Thomas Winiecki, Reading (GB)

(73) Assignee: Sequans Communications Limited, Reading (GB)

( * ) Notice: Subject to any disclaimer, the term of this patent is extended or adjusted under 35 U.S.C. 154(b) by 0 days.

(21) Appl. No.: 14/548,888

(22) Filed: Nov. 20, 2014

(65) Prior Publication Data
US 2015/0146820 A1   May 28, 2015

(30) Foreign Application Priority Data
Nov. 22, 2013  (EP) ..................................... 13194170

(51) Int. Cl.
| | |
|---|---|
| H04L 25/03 | (2006.01) |
| H03F 1/32 | (2006.01) |
| H04L 27/36 | (2006.01) |
| H04L 25/06 | (2006.01) |
| H03F 3/189 | (2006.01) |
| H03F 3/24 | (2006.01) |

(52) U.S. Cl.
CPC ........ *H04L 25/03828* (2013.01); *H03F 1/3241* (2013.01); *H03F 1/3258* (2013.01); *H03F 1/3294* (2013.01); *H03F 3/189* (2013.01); *H03F 3/245* (2013.01); *H04L 25/06* (2013.01); *H04L 27/367* (2013.01); *H03F 2200/336* (2013.01)

(58) Field of Classification Search
USPC .......................... 375/296, 260, 130; 370/252
See application file for complete search history.

(56) References Cited

U.S. PATENT DOCUMENTS

| | | | |
|---|---|---|---|
| 5,111,155 A | 5/1992 | Keate et al. | |
| 7,916,797 B2 * | 3/2011 | Yu et al. | 375/260 |
| 8,107,393 B2 * | 1/2012 | Vanganuru et al. | 370/252 |
| 2003/0067963 A1 * | 4/2003 | Miller et al. | 375/130 |
| 2013/0044791 A1 | 2/2013 | Rimini et al. | |

FOREIGN PATENT DOCUMENTS

GB          2339657 A    2/2000

OTHER PUBLICATIONS

European Search Report, EP 13194170.0, date of mailing Jan. 23, 2014.

* cited by examiner

*Primary Examiner* — Eva Puente
(74) *Attorney, Agent, or Firm* — Hamilton, Brook, Smith & Reynolds, P.C.

(57) ABSTRACT

An apparatus and method for reducing unwanted spectral emissions of a complex signal to be transmitted comprising calculating the nth power of the complex signal to be transmitted, calculating the complex conjugate of the nth power of the complex signal to be transmitted, applying a scaling factor to the complex conjugate to form a scaled correction signal, and adding the scaled correction signal to the signal to be transmitted.

16 Claims, 8 Drawing Sheets

| | Y | | | | | | | | | | | | | | | |
|---|---|---|---|---|---|---|---|---|---|---|---|---|---|---|---|---|
| X | | 7 | 6 | 5 | 4 | 3 | 2 | 1 | 0 | -1 | -2 | -3 | -4 | -5 | -6 | -7 | -8 |
| | 7 | -7 | -4 | -2 | 0 | 1 | 2 | 3 | 3 | 3 | 3 | 2 | 1 | 0 | -2 | -4 | -7 |
| | 6 | -6 | -4 | -2 | -1 | 0 | 1 | 2 | 2 | 2 | 2 | 1 | 0 | -1 | -2 | -4 | -6 |
| | 5 | -6 | -4 | -3 | -1 | 0 | 0 | 1 | 1 | 1 | 1 | 0 | 0 | -1 | -3 | -4 | -6 |
| | 4 | -5 | -4 | -2 | -1 | -1 | 0 | 0 | 1 | 1 | 0 | 0 | 0 | -1 | -1 | -2 | -4 | -5 |
| | 3 | -4 | -3 | -2 | -1 | -1 | 0 | 0 | 0 | 0 | 0 | 0 | -1 | -1 | -2 | -3 | -4 |
| | 2 | -3 | -2 | -2 | -1 | 0 | -1 | 0 | 0 | 0 | 0 | 0 | -1 | -1 | -2 | -2 | -3 |
| | 1 | -2 | -1 | -1 | -1 | 0 | 0 | 0 | 0 | 0 | 0 | 0 | -1 | -1 | -1 | -2 |
| | 0 | -1 | 0 | 0 | 0 | 0 | 0 | 0 | 0 | 0 | 0 | 0 | 0 | 0 | 0 | -1 |
| | -1 | 1 | 0 | 0 | 0 | 0 | 0 | 0 | 0 | 0 | 0 | 0 | 0 | 0 | 0 | 1 |
| | -2 | 2 | 1 | 1 | 0 | 0 | 0 | 0 | 0 | 0 | 0 | 0 | 1 | 1 | 1 | 2 |
| | -3 | 3 | 2 | 2 | 1 | 1 | 0 | 0 | 0 | 0 | 0 | 1 | 1 | 2 | 2 | 3 |
| | -4 | 4 | 3 | 2 | 2 | 1 | 1 | 0 | 0 | 0 | 0 | 1 | 1 | 2 | 2 | 3 | 4 |
| | -5 | 5 | 4 | 2 | 1 | 1 | 1 | 0 | 0 | -1 | -1 | 0 | 0 | 1 | 1 | 2 | 4 | 5 |
| | -6 | 6 | 4 | 3 | 1 | 0 | 0 | -1 | 0 | -1 | -1 | 0 | 0 | 1 | 3 | 4 | 6 |
| | -7 | 6 | 4 | 2 | 2 | 1 | 0 | -1 | -2 | -2 | -1 | 0 | 1 | 2 | 2 | 4 | 6 |
| | -8 | 7 | 4 | 2 | 0 | -1 | -2 | -3 | -3 | -3 | -3 | -2 | -1 | 0 | 2 | 4 | 7 |

Figure 5

(Regions labeled 52 for X = 0..7 and 54 for Y = 0..7)

TRANSMITTER LINEARIZATION

RELATED APPLICATION

This application claims priority under 35 U.S.C. §119 or 365 to European Patent Application No. EP 13194170.0, filed Nov. 22, 2013. The entire teachings of the above application are incorporated herein by reference.

TECHNICAL FIELD

This invention relates to transmitter linearization and reducing unwanted spectral emissions. It is related to feed forward schemes and is particularly suitable for, but by no means limited, to use with the LTE and WiMAX standards.

BACKGROUND

In wireless telecommunication systems, the transmit signal typically occupies a well-defined range of the frequency spectrum and power emitted outside this frequency range is subject to maximum emission limits imposed by regulatory or other requirements. These requirements ensure communication equipment using different parts of the frequency spectrum do not excessively interfere with one another.

The 3GPP (3rd Generation Partnership Project) specification for E-UTRA (evolved UMTS Terrestrial Radio Access), better known as LTE (Long Term Evolution), currently lists 38 different frequency bands for use by the latest generation of cellular communication equipment. Many of these bands are located in close vicinity to each other or to frequency bands of incumbent technologies such as television broadcast.

In a number of cases, out-of-band emissions are restricted to very low levels just outside the allocated frequency bands. One example of particular interest relates to emissions from LTE band 13 (777 MHz to 787 MHz) into a US public safety band (769 MHz and 775 MHz). Another example is emissions from LTE band 1 (1920 MHz to 1980 MHz) into the PHS (Personal Handy-phone System) band (1884.5-1915.7 MHz) which is in use in Japan.

Emissions are also often restricted where two frequency bands are immediately adjacent to one another. For example, there is no gap between LTE bands 42 and 43 and therefore emissions from band 42 into band 43 and vice versa are restricted. Similar constraints apply to LTE bands 23 and 25 as well as bands 1 and 33. In the future, more frequency spectrum may be dedicated to cellular communication equipment and therefore coexistence requirements will increase.

Stringent emission limits that apply just a few Megahertz outside the desired transmit channel impose a number of challenging design constraints on the transmitter architecture.

FIG. 1 shows a simplified block diagram of a representative architecture of a state-of-the-art LTE transmitter (10). User data (11) is interleaved with control data (not shown) and modulated (12) using a technique called SC-FDMA (Single-Carrier Frequency Division Multiple Access) which yields a stream of time-domain data symbols (13). The signal comprising the symbols includes real and imaginary parts that are commonly referred to as I and Q (in-phase and quadrature components). The I and Q signal paths as shown propagate throughout the digital and analog parts of the architecture of the transmitter and are re-combined at the IQ modulator 20. Between the symbols 13 a cyclic prefix (14) is inserted to effectively create a guard time between the data symbols. At this point in the signal chain the frequency spectrum associated with the data stream is not very well confined to the desired bandwidth and must be shaped by digital filtering (15) to reject unwanted out-of-band emissions. Typically, the data stream is then up sampled (16) to a rate multiple times the native LTE symbol rate which by a process known as aliasing again produces unwanted out-of-band emissions as would be understood. These can be removed using the anti-aliasing filter (17).

The signal can then be converted from the digital into the analog domain using a DAC (18). The radio topology shown is known as a zero-IF architecture where the complex baseband signal is represented by two real-valued signal paths (in-phase and quadrature components, commonly referred to as I and Q) in the analog domain as would be understood. This type of architecture is common in low-cost transceiver designs based on CMOS technology.

Following the DAC, the signal is filtered again (19), mainly to remove DAC quantization noise at the duplex offset for Frequency Division Duplexing (FDD) radio bands. Then, the I and Q signal paths are jointly up converted onto an RF carrier in the IQ modulator block (20) as would be understood. The RF signal is then amplified (21) by an RF amplifier followed by a power amplifier and filtered again (22) before being transmitted from the antenna (23).

Emission limits as discussed previously set design constraints on a number of blocks shown in the architecture in FIG. 1. For example, the combination of pulse shaping (15), digital anti-aliasing filter (17) and analog reconstructing filter (19) must suppress out-of-band power at the critical frequency offsets adequately so they have negligible contribution to out-of-band noise after up-conversion (20) to RF and RF amplification (21).

Many linearization schemes or pre-distortion schemes have been proposed that aim to counteract non-ideal characteristics of the power amplifier with the aim of improving its linearity and power efficiency. In these schemes the correction signal is calculated to minimize spectral re-growth due to different frequency components in a wide-band signal mixing with each other. This improves the spectral characteristics of wide-band signals. However, the correction terms applied, themselves, have frequencies close to the desired frequencies and do not typically improve emissions at frequency offsets several multiples away from the desired frequency.

SUMMARY

According to a first aspect there is provided a method of reducing unwanted spectral emissions of a complex signal to be transmitted as defined in Claim 1 of the appended claims. The method comprises the steps of calculating the nth power of the complex signal to be transmitted, calculating the complex conjugate of the nth power of the complex signal to be transmitted, applying a scaling factor to the complex conjugate to form a scaled correction signal, and adding the scaled correction signal to the complex signal to be transmitted.

Optionally, the method further comprises applying a phase change to the scaled correction signal.

Optionally, the method wherein calculating the complex conjugate comprises retrieving a pre-determined value from a lookup table.

Optionally, the method wherein the lookup table comprises at least two inputs of at least 3-bits and a 4-bit output.

Optionally, the method wherein the lookup table comprises hard-wired logic arranged to map the input bits to the output bits.

Optionally, the method wherein applying the scaling factor, α and phase change, θ comprises multiplying the complex conjugate by a vector comprising A=α·cos θ and B=α·sin θ.

Optionally, the method wherein the signal to be transmitted is an LTE signal and A and B are determined based on an RB Start value and optionally an RB num value.

Optionally, the method wherein A and B are determined based on a quadratic profile of the power of the unwanted spectral emissions.

Optionally, the method wherein the signal to be transmitted is a WiMAX signal.

Optionally, the method further comprises calculating a plurality of complex conjugates, applying a scaling factor to each of the complex conjugates to form a plurality of scaled correction signals, and adding each of the scaled correction signals to the complex signal to be transmitted.

Optionally, the method further comprises applying a phase change to at least one of the scaled correction signals.

Optionally, the complex signal to be transmitted may comprise in-phase and quadrature components.

Optionally, the method is carried out in the digital domain.

In a second aspect there is provided an apparatus arranged to reduce unwanted spectral emissions of a signal to be transmitted comprising a processor arranged to carry out the method.

In a third aspect there is provided a computer readable medium comprising instructions that when executed by a processor causes the processor to carry out the method.

With all the aspects, preferable and optional features are defined in the dependent claims.

BRIEF DESCRIPTION OF THE DRAWINGS

Embodiments will now be described, by way of example only, and with reference to the drawings in which:

FIG. 5 illustrates a lookup table of the function $\frac{1}{2} \cdot (X^3 - 3 \cdot X \cdot Y^2)$ calculated based on 4-bit inputs and 4-bit outputs according to an embodiment;

In the figures, like elements are indicated by like reference numerals throughout.

DETAILED DESCRIPTION

Figure 1:
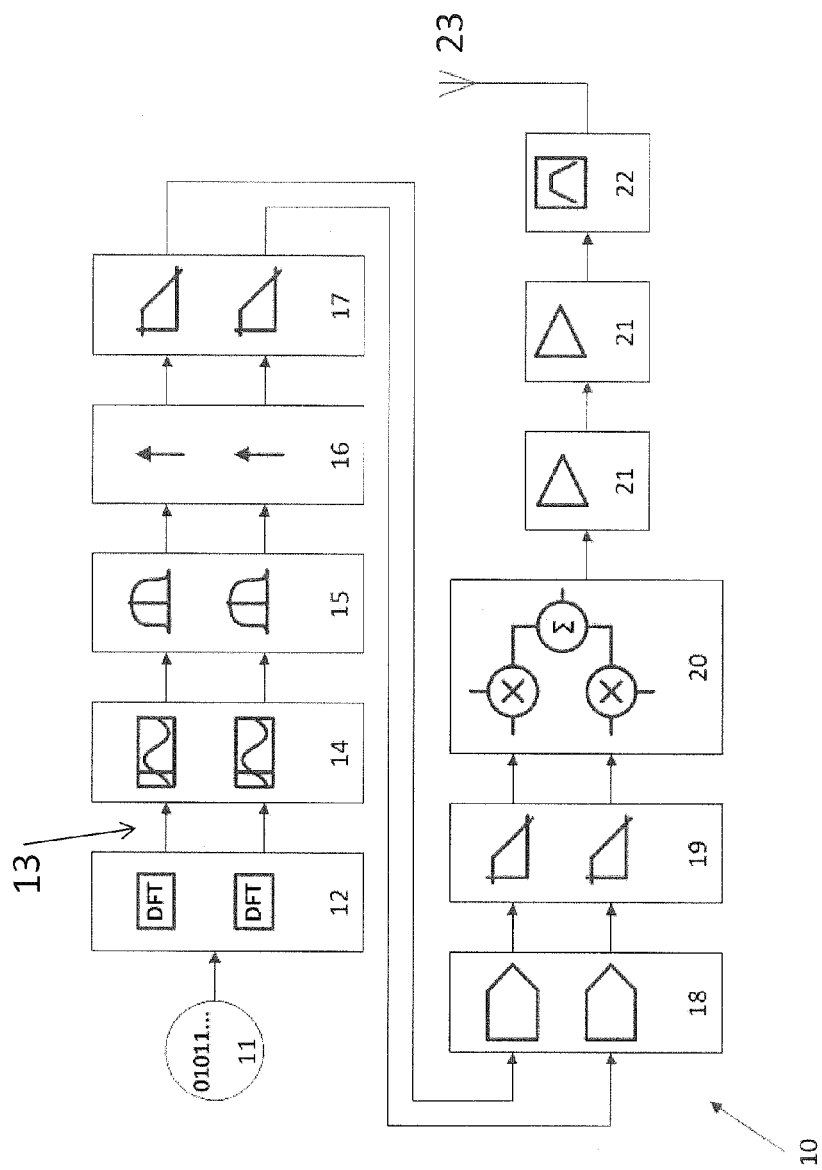
FIG. 1 illustrates a block diagram of a known LTE transmitter.

The linearization scheme aims to cancel the base-band harmonics of the transmit signal due to the mechanisms described above. This is achieved by applying a correction signal that is calculated and added to the desired signal so that it cancels out an error signal or distortion caused in subsequent stages in the form of feed forward linearization.

A correction signal is added within a digital processing unit that is in anti-phase to the unwanted frequency product generated in the analog and RF circuits thereby cancelling out the unwanted emissions.

This is of particular benefit for transmission schemes as defined as part of the LTE and WiMAX standard where the total transmit power can be concentrated in a narrow frequency range at an offset from the carrier. In these cases the scheme effectively reduces out-of-band emissions that would otherwise arise in the transmitter.

As would be understood, the linearity of all blocks in the RF signal path is usually a key dimensioning requirement. Non-linear behavior leads to mixing of different frequency components of the desired signal. Some of the mixing products will fall into the transmit band in question and degrade signal quality.

Other mixing products may fall outside the transmit band (or channel in use) and lead to unwanted emissions in neighboring frequency bands or channels. Typically, third order inter-modulation products dominate which lead to undesired frequency components just outside the allocated transmit band (known as spectral re-growth). Assuming the wide-band signal contains frequency components $f_1$ and $f_2$, then third-order intermodulation products fall at frequencies $2f_1-f_2$ and $2f_2-f_1$ and the spectral re-growth components due to third order non-linearity occupy a frequency interval of three times the signal bandwidth (bandwidth of channel plus one bandwidth either side making three times the channel bandwidth of spectral re-growth components). Therefore, if the separation between transmit band (channel) in use and a protected frequency region is smaller than the width of the allocated band then third order distortion must be kept small enough to meet emission limits into the protected band.

Third order non-linearity can also lead to unwanted emissions for narrow allocations such as those used in LTE or WiMAX standards. These narrow allocations are the focus of the described linearization scheme. Consider a complex tone representing a complex signal being injected into the I and the Q-branch of the analog re-construction filter (19). The input signal on the I-branch may be described as $$V_{in,I} = A \cdot \cos(\Omega_{IF} \cdot t)$$

and that on the Q-branch as $$V_{in,Q} = A \cdot \sin(\Omega_{IF} \cdot t).$$

The baseband signal path is typically realized using differential circuitry which has almost negligible even-order non-linearity. This is because even-order harmonics created in parts of the circuit carrying the positive signal are equal in amplitude and phase to those created in the parts of the circuit carrying the negative half of the circuit. If subsequent stages are only sensitive to the difference in signal value between positive and negative branches then even-order frequency products are not amplified but rejected.

Therefore, the presence of only odd-order non-linearity is assumed which in its most general form can be expressed as a polynomial of the form:

$$V_{out} = c_1 \cdot V_{in} + c_3 \cdot V_{in}^3 + c_5 \cdot V_{in}^5 + \ldots,$$

where $V_{in}$ is the (differential) input signal the circuit receives and $V_{out}$ the (differential) output signal.

Using the expressions for $V_{in,I}$ and $V_{in,Q}$ and some simplification, the corresponding output signals are described by the following expressions:

$$V_{out,I} = a \cdot (c_1 + \tfrac{3}{4}c_3 + \tfrac{5}{8}c_5 + \ldots) \cdot \cos(\Omega_{IF} \cdot t) + a^3 \cdot (+\tfrac{1}{4}c_3 + \tfrac{5}{16}c_5 + \ldots) \cdot \cos(3 \cdot \Omega_{IF} \cdot t) + a^5 \cdot (+\tfrac{1}{16}c_5 + \ldots) \cdot \cos(5 \cdot \Omega_{IF} \cdot t) + \ldots \quad (1)$$

$$V_{out,Q} = a \cdot (c_1 + \tfrac{3}{4}c_3 + \tfrac{5}{8}c_5 + \ldots) \cdot \sin(\Omega_{IF} \cdot t) + a^3 \cdot (-\tfrac{1}{4}c_3 - \tfrac{5}{16}c_5 + \ldots) \cdot \sin(3 \cdot \Omega_{IF} \cdot t) + a^5 \cdot (+\tfrac{1}{16}c_5 + \ldots) \cdot \sin(5 \cdot \Omega_{IF} \cdot t) + \ldots \quad (2)$$

When (1) and (2) are up-converted to RF in a quadrature mixer and summed (20) the resulting spectrum contains frequency products at odd harmonics of the input signal. We assume $c_1 \gg c_3 \gg c_5$. The angular frequency of the carrier shall be denoted as $\Omega_{LO}$.

$$V_{RF} = V_{out,I} \cdot \cos(\Omega_{LO} \cdot t) - V_{out,Q} \cdot \sin(\Omega_{LO} \cdot t)$$

$$V_{RF} = a \cdot c_1 \cdot \cos((\Omega_{LO} + \Omega_{IF}) \cdot t) +$$

$$\tfrac{1}{4} \cdot a^3 \cdot c_3 \cdot \cos((\Omega_{LO} - 3 \cdot \Omega_{IF}) \cdot t) +$$

$$\tfrac{1}{16} \cdot a^3 \cdot c_5 \cdot \cos((\Omega_{LO} + 5 \cdot \Omega_{IF}) \cdot t) + \ldots$$

Figure 2:
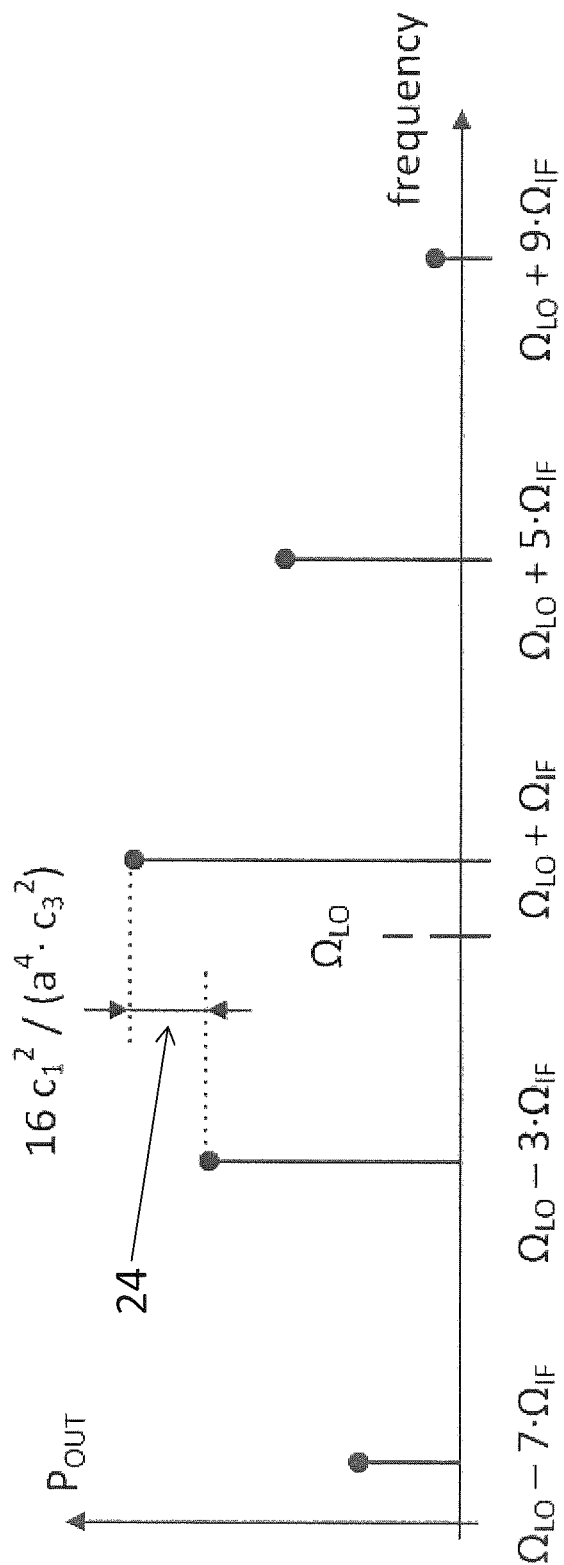
FIG. 2 illustrates frequency spectrum at RF output and odd-order non-linearity in the IQ modulator creating unwanted out-of-band products at frequency offsets corresponding to odd multiples of the input signal frequency offset from the carrier.

Tones appear only on one side of the carrier due to the image cancellation occurring in the summation stage of the IQ modulator. The resulting spectrum is illustrated in FIG. 2.

The rejection of the third-order product at $\Omega_{LO} - 3 \cdot \Omega_{IF}$, which is referred to as SH3R (signal to third harmonic ratio, 24), is given by the ratio $16\, c_1^2/(a^4 \cdot c_3^2)$.

The LO (local oscillator) or clock signal driving the switches that make up the IQ modulator (as would be understood) is typically designed to have sharp edge transitions. In other words, the LO output or clock signal resembles a square wave which contains significant power at the third and higher odd harmonics of the LO frequency. The square wave may be expressed as a Fourier series as follows:

$$V_{LO,I,square} \sim \sin(\Omega_{LO} \cdot t) + \tfrac{1}{3} \cdot \sin(3 \cdot \Omega_{LO} \cdot t) + \tfrac{1}{5} \cdot \sin(5 \cdot \Omega_{LO} \cdot t) + \ldots$$

The associated quadrature component (fundamental shifted by 90 degrees is given by):

$$V_{LO,Q,square} \sim \cos(\Omega_{LO} \cdot t) - \tfrac{1}{3} \cdot \cos(3 \cdot \Omega_{LO} \cdot t) + \tfrac{1}{5} \cdot \cos(5 \cdot \Omega_{LO} \cdot t) + \ldots$$

These additional frequency components will also up-convert the base-band tone leading to a frequency component at $3 \cdot \Omega_{LO} - \Omega_{IF}$ as demonstrated by the following identities:

$$V_{out,RF} = b \cdot \cos(\Omega_{IF} \cdot t) \cdot (g_1 \cdot \cos(\Omega_{LO} \cdot t) - g_3 \cdot \cos(3 \cdot \Omega_{LO} \cdot t) + \ldots) - b \cdot \sin(\Omega_{IF} \cdot t) \cdot (g_1 \cdot \sin(\Omega_{LO} \cdot t) + g_3 \cdot \sin(3 \cdot \Omega_{LO} \cdot t) + \ldots) = b \cdot g_1 \cdot \cos((\Omega_{LO} + \Omega_{IF}) \cdot t) + b \cdot g_3 \cdot \sin((3 \cdot \Omega_{LO} - \Omega_{IF}) \cdot t). \quad (3)$$

In any amplification stage subsequent to the IQ modulator (shown as RF amplifier and power amplifier 21 in FIG. 1) the frequency product at $3 \cdot \Omega_{LO} - \Omega_{IF}$ may mix with the wanted tone at $\Omega_{LO} + \Omega_{IF}$ leading again to a product at $\Omega_{LO} - 3 \cdot \Omega_{IF}$. This mechanism further contributes to unwanted power at this frequency offset and degrades SH3R.

For LTE band 13 support of a narrow RB (resource block) allocation at full power requires a rejection of the unwanted tone by SH3R>66 dB with respect to the wanted tone to meet emission specs for the public safety band.

This requirement is much more stringent than the general linearity requirement derived from transmit spectral mask, ACLR (adjacent channel leakage ratio) or EVM (error vector magnitude) specifications that an LTE or WiMAX transmitter must meet. Note that the rejection requirement is much easier to meet for wider allocations (wider signal bandwidths) as the power of the third harmonic signal is spread out over a wider frequency and the power spectral density is lower.

Figure 3:
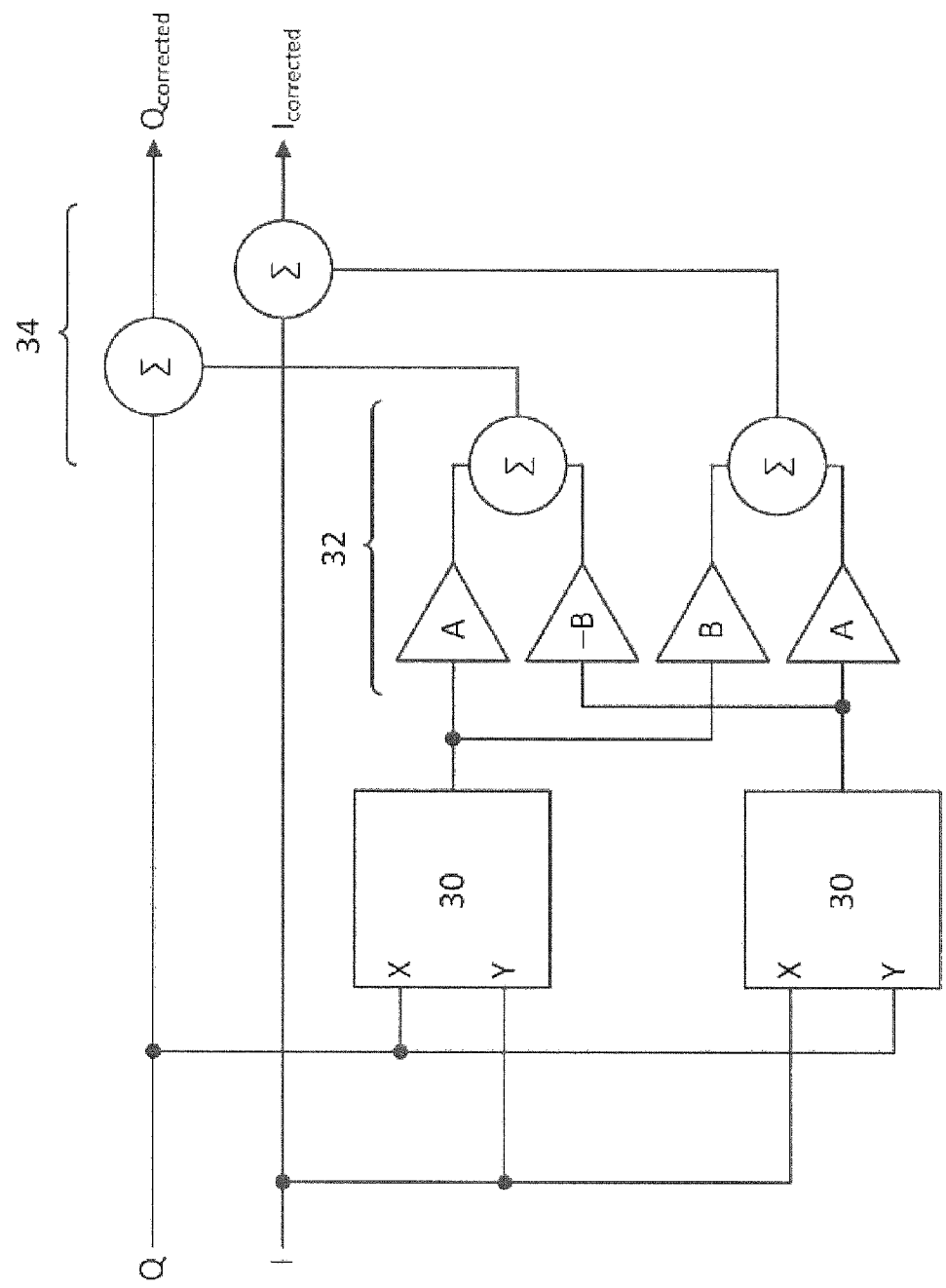
FIG. 3 illustrates an implementation of the linearization scheme according to an embodiment.

Turning to FIG. 3, the digital signals for transmission are represented as two sample streams, I and Q as would be understood. To generate the correction signal for third-order distortion the cube of the signal is calculated. Cubing I and Q individually would create frequencies at three times the desired tone as well as frequencies that fall in the transmission band. For example, assume $$I = \cos(\Omega_{IF} \cdot t) \text{ then } I^3 = \tfrac{1}{4}\cos(3 \cdot \Omega_{IF} \cdot t) + \tfrac{3}{4}\cos(\Omega_{IF} \cdot t).$$

The cube of the complex signal, $S = I + j \cdot Q$, is therefore calculated as follows:

$$S^3 = (I^3 - 3 \cdot I \cdot Q^2) - j \cdot (Q^3 - 3 \cdot Q \cdot I^2).$$

This quantity only contains frequencies at three times the desired frequency. Since the IQ modulator generates unwanted tones at a frequency offset given by $-3 \cdot \Omega_{IF}$ from the carrier (as shown in FIG. 2), the correction signal should also be applied at negative frequencies. This is achieved by calculating the complex conjugate of the cube:

$$\mathrm{Conj}(S^3) = (I^3 - 3 \cdot I \cdot Q^2) + j \cdot (Q^3 - 3 \cdot Q \cdot I^2).$$

Figure 8:
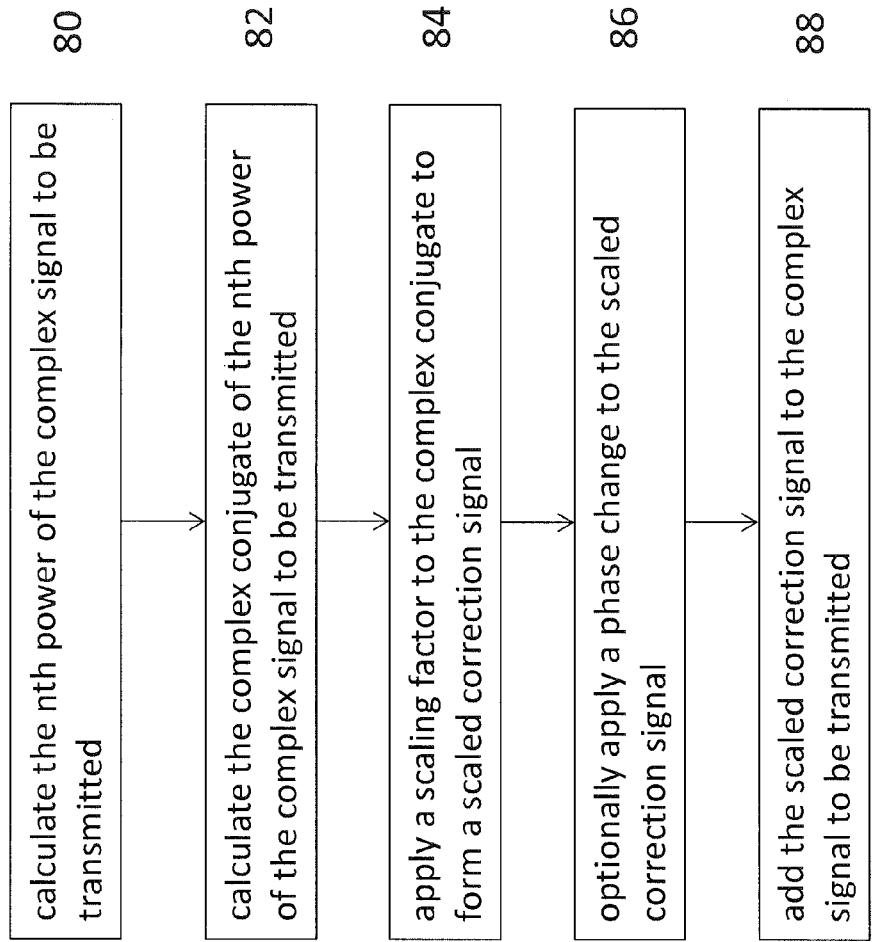
FIG. 8 illustrates a method according to an embodiment.

The same principle may be used to extend to producing a correction signal for nth order distortion by calculating the complex signal to the power n (the nth power) and the complex conjugate of the signal to the power n (the nth power) as shown in FIG. 8 steps 80 and 82.

This correction signal should further be scaled by a factor a to obtain the magnitude that matches the magnitude of the third harmonic product created in the analog circuitry. The same principle may be used to scale a correction signal for nth order distortion as shown in FIG. 8 step 84. Finally, a phase delay (or advance), denoted θ in the following, may be applied because the delay of the signal propagating through the transmit path may be different to the delay the correcting signal experiences. The same principle may be used to apply a phase change to a correction signal for nth order distortion as shown in FIG. 8 optional step 86.

The overall correction applied may be expressed as follows in vector notation:

$$(I; Q)_{corrected} = (I; Q) + \alpha \, (\cos\theta, -\sin\theta; \sin\theta, \cos\theta) \cdot (I^3 - 3 \cdot I \cdot Q^2; Q^3 - 3 \cdot Q \cdot I^2).$$

Here, α is a scaling factor and the 2×2 matrix performs a rotation of the vector about the angle θ. Instead of α and θ we can also express the scaling and rotation using the two dimensionless parameters $A = \alpha \cdot \cos\theta$ and $B = \alpha \cdot \sin\theta$ giving:

$$(I; Q)_{corrected} = (I; Q) + (A, -B; B, A) \cdot (I^3 - 3 \cdot I \cdot Q^2; Q^3 - 3 \cdot Q \cdot I^2).$$

As can be seen, the correction signal is added to the signal to be transmitted as shown in FIG. 8 step 88. The correction signal may be applied at any point in the digital signal path before the digital-to-analog convertors (18). The sampling rate at the point of signal correction must be high enough so that the correction signal falls below the Nyquist rate to avoid aliasing to other frequencies. This means the sampling rate should be at least twice as high as the frequency of the correction signal.

FIG. 3 illustrates an implementation according to an embodiment and shows signal flow which may occur within a processor or other dedicated digital processing unit such as an FPGA or PLD. As can be seen, the cubic function may be calculated first. The functional format of the cubic term is symmetrical for I and Q paths. Once the cubic terms are calculated the scaling and rotation may be applied.

The embodiment comprises two identical blocks (30) for calculation of the cubic terms with inputs I and Q swapped around. The outputs are then scaled and summed (32) before they are summed with the original signals (34).

Alternative arrangements of the scaling and summing steps are possible, for example, scaling may be applied before the non-linear block (30).

The cubic calculations may be computationally very expensive, especially because they must be performed at a sampling rate high enough to avoid the frequency products at three times the desired signal frequency from aliasing.

However, the cubic computations may be performed not in real-time. Instead, the cubic calculation may be approximated using a look-up table of pre-computed values. Further, the input and output-precision of the look-up table may be reduced to just 4 bits.

Figure 4:
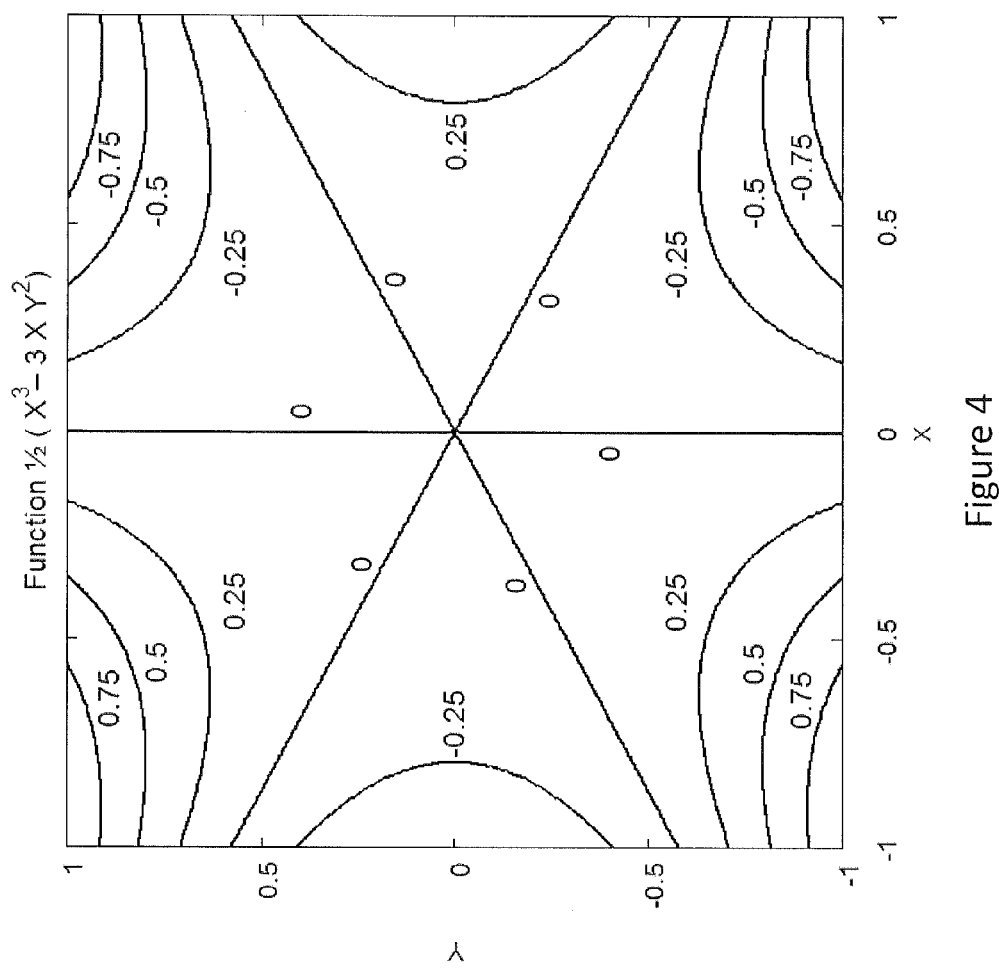
FIG. 4 illustrates a contour plot showing the levels of the function $\frac{1}{2} \cdot (X^3 - 3 \cdot X \cdot Y^2)$ according to an embodiment.

FIG. 4 shows a contour plot of the function $½·(X^3−3·X·Y^2)$ plotted against the inputs X and Y when calculated with high precision. The factor ½ is applied to ensure the output is conveniently scaled to a range between −1 and +1 when both X and Y run from −1 to +1 as confirmed in FIG. 4. As can be seen, the function exhibits odd symmetry in the X-direction and even symmetry in the Y-direction. These symmetries can be exploited to ease computational complexity as will be described.

Turning to FIG. 5, there is illustrated a simplified mapping based on 4-bit inputs for X and Y and a 4-bit output. Any other truncation scheme could be used alternatively as a trade-off between speed of calculation and accuracy. Both inputs and output are represented by integer numbers running from −8 to 7 (16 values).

As highlighted in FIG. 5, symmetries in the map can be used to reduce the size of the map to 3 bits input for each X (52) and Y (54). For example, if X and Y are represented as signed integers (commonly known as two's complement representation) then the sign bit in Y can be ignored for the calculations while the sign bit of X can be used to negate the result of the mapping.

If the mapping is then implemented using a look-up table the total storage size would be 4 bit·$2^{3+3}$=256 bit. Since the calculation of the cubic terms is fixed, the table can be implemented as read-only memory and is therefore very small and does not take up very much storage space hence allowing a lower specification of implementing device with reduced associated memory. A further size reduction may be achieved by synthesizing hard-wired logic (for example an FPGA or PLD) that maps the 6 input bits (3 bits of X and 3 bits of Y) to the 4 output bits. Yet another alternative would be to perform the calculations directly using reduced precision fixed-point arithmetic in a processing device.

Figure 6:
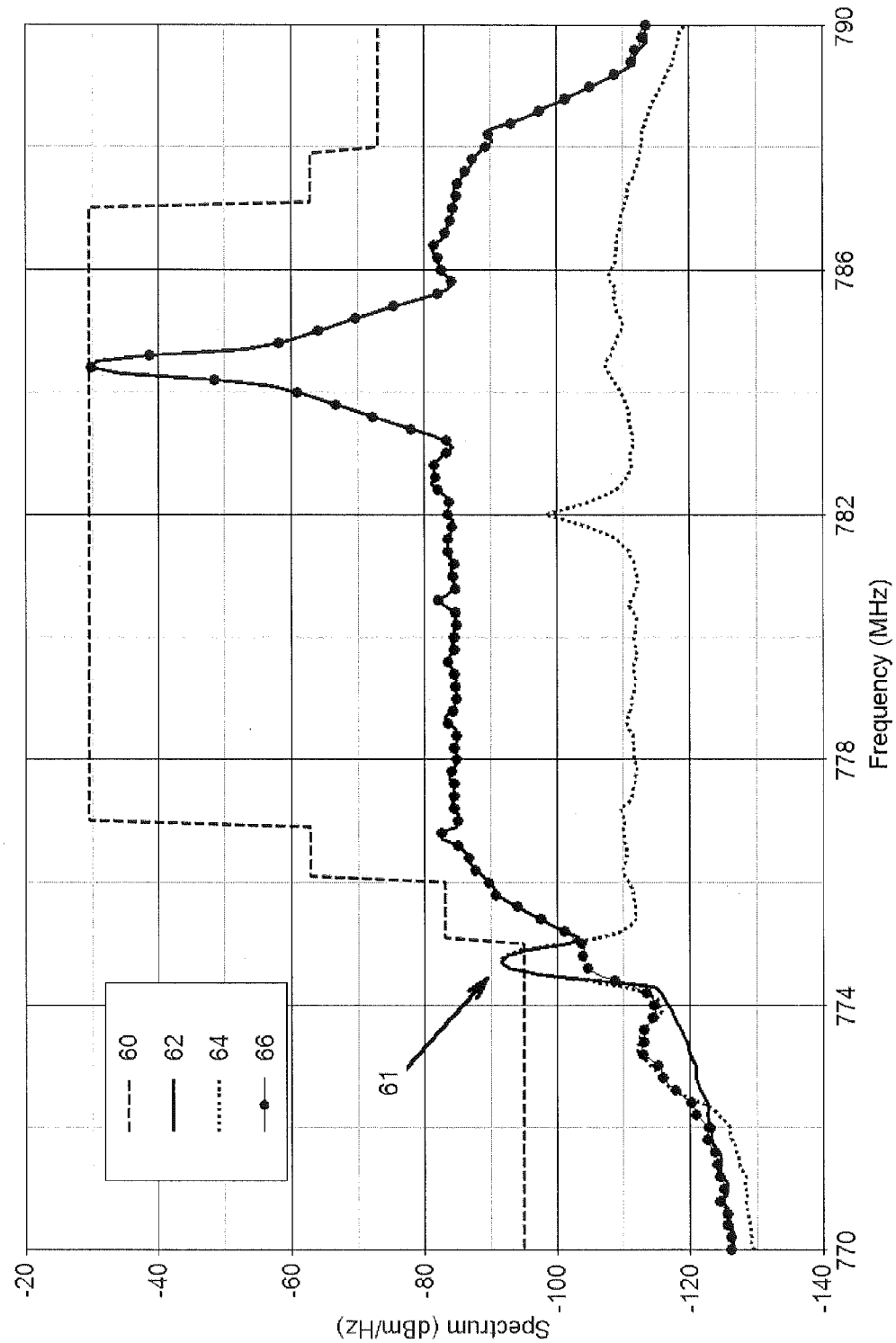
FIG. 6 illustrates antenna power spectral density with and without correction according to an embodiment.

FIG. 6 illustrates the benefit of the scheme. Curve 62 shows the simulated power spectral density of the transmitted signal at the antenna output. In this example, the carrier is 782 MHz (LTE band 13) and the wanted signal at 2.43 MHz offset (RB_start=38). Non-linearities in the transmit chain create an unwanted frequency component (61) at −3·2.43 MHz from the carrier (around 774.71 MHz). This unwanted product falls into a protected frequency band indicated by the mask (60).

Without applying the linearization scheme, the emission target (60) is violated. However, once the correction term (64) is added, the unwanted emissions are greatly reduced (66) and the unwanted peak 61 is reduced. As can be seen, the original signal (62) and the correction signal (64) have roughly the same magnitude at the frequency offset of interest. However, because they are opposite in phase the summed signal (66) does not show the peaking (61).

Figure 7:
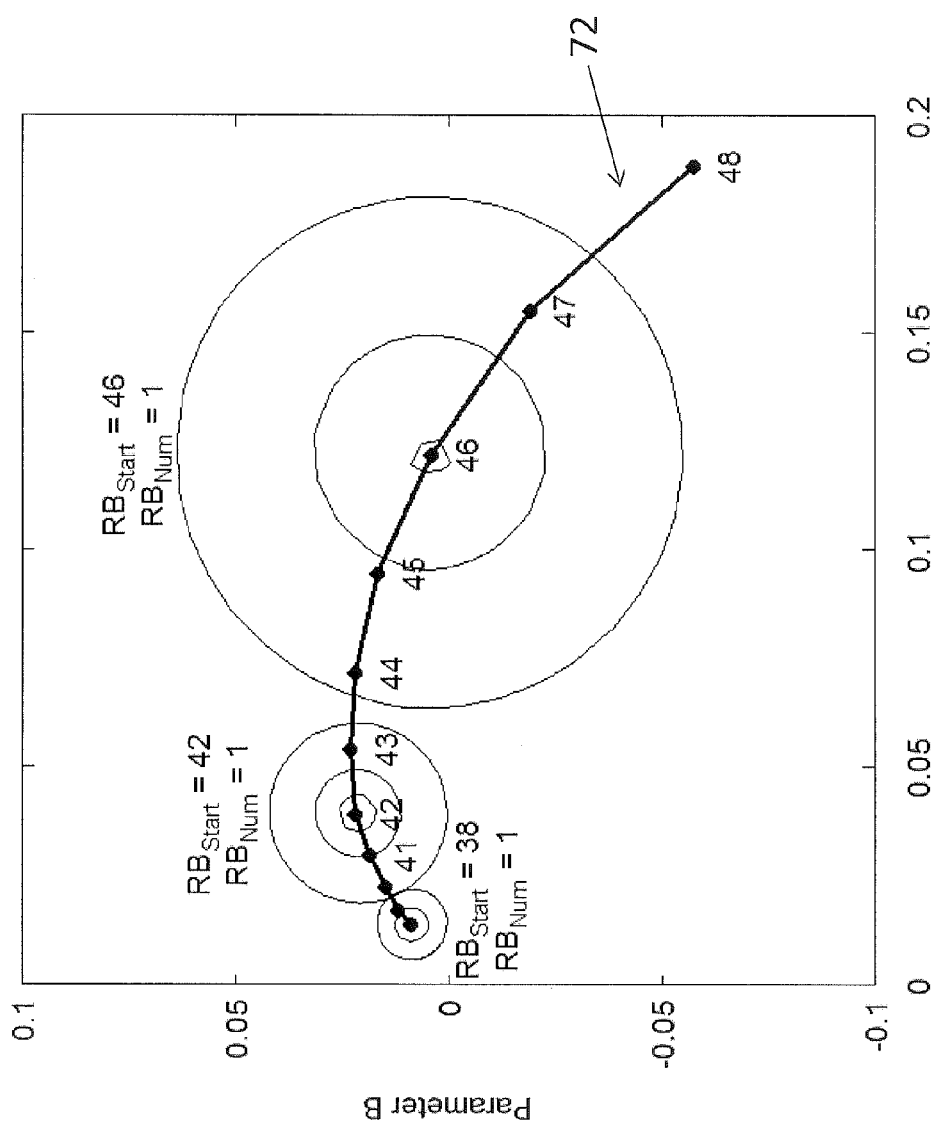
FIG. 7 illustrates a contour plot showing rejection achieved for different locations of the desired signal according to embodiments.

The parameters A and B are chosen so that the correction signal has the required magnitude and phase. FIG. 7 illustrates the sensitivity of the achieved rejection to the parameters A and B.

The different families of curves (sets of concentric circles) refer to different locations of the desired signal. In LTE, for example, the position of the signal within the channel is denoted by the RB_Start value. FIG. 7 shows examples of RB_Start from 38 to 48 corresponding to a frequency offset between 2.43 MHz and 4.23 MHz. The bandwidth of the desired signal is 180 kHz (1RB) in all cases.

The bold trace (72) shows the optimum pair of A and B parameters for 1RB transmissions for $RB\_Start$=38 to 48. As can be seen, both parameters A and B depend strongly on RB location. This is because the correction signal superimposed to the signal in the digital domain is out-of-band and as it goes through various filtering stages it is attenuated more and more. Therefore, for higher RB_start value more correction signal is injected. The filtering response of the signal path is generally known which means the location of the optimum parameters A and B can be calculated.

For three selected RB_start values (38, 42 and 46), thinner contour lines are shown that indicate how much rejection of unwanted signal is achieved. The maximum rejection achieved is around 20 dB (depending on the level of approximation done in the computation of the cubic signal this level may vary). The contour lines show the level of 6 dB (largest circle), 12 dB and 18 dB (smallest circle) rejection.

The examples shown relate specifically to LTE band 13 and unwanted emissions into the protected frequency region 769-775 MHz. For other LTE frequency bands or other technologies (e.g. WiMAX) emissions into different frequency bands or at different offsets from the carrier may be targeted in the same way. For WiMAX, groups of subcarriers are referred to as sub-channels. As a result, the optimum A and B parameters will be a function of the selected sub-channel configuration. As is the case for LTE, the dependence of A and B parameters on sub-channel configuration will reflect the frequency-dependent attenuation and phase shifts that occur between the point where the correction signal is added into the signal path and the point where the non-linearity occurs.

To understand how the achieved rejection depends on the A and B parameters, assume that perfect cancellation is achieved for the parameter pair $A_{opt}$ and $B_{opt}$.

Selecting a different parameter set then leads to a residual error vector given by:

$$(I; Q)\text{error}=(A, -B; B, A)·(C_I; C_Q)-(A_{opt}, -B_{opt}; B_{opt}, A_{opt})·(C_I; C_Q).$$

where $C_I=I^3-3·I·Q^2$ and $C_Q=Q^3-3·Q·I^2$.

If we calculate the square of the magnitude of the error vector (which is a measure of power at the unwanted frequency) we obtain:

$$P_{error}=|(I; Q)_{error}|^2=((A-A_{opt})^2+(B-B_{opt})^2)·(C_I^2+C_Q^2)=((A-A_{opt})^2+(B-B_{opt})^2)·(I^2+Q^2)^3$$

Therefore, the power in the unwanted tone increases with the square of the difference between the selected correction parameters and the optimum values. The contour lines of constant rejection achieved are circles around the optimum tuning setting.

The quadratic profile of the power with respect to the tuning parameters, A and B may be used to find the optimum setting.

As an example, a procedure is described where the power of the unwanted product is measured using four different combinations of A and B tuning parameters. The four power measurements $P_1$, $P_2$, $P_3$ and $P_4$ can then be used to calculate the optimum values $A_{opt}$ and $B_{opt}$ that minimize the unwanted spectral emissions.

$$P_1=P(A_0+\Delta, B_0+\Delta)=P_0·((A_0+\Delta-A_{opt})^2+(B_0+\Delta-B_{opt})^2)$$

$$P_2=P(A_0+\Delta, B_0-\Delta)=P_0·((A_0+\Delta-A_{opt})^2+(B_0-\Delta-B_{opt})^2)$$

$$P_3=P(A_0-\Delta, B_0+\Delta)=P_0·((A_0-\Delta-A_{opt})^2+(B_0+\Delta B_{opt})^2)$$

$$P_4=P(A_0, B_0)=P_0·((A_0-A_{opt})^2+(B_0-B_{opt})^2).$$

Here, $P_0$ is a scalar factor that applies to all measurements which is a combination of the magnitude of the unwanted tone and any (generally not precisely known) gain to the point where the unwanted tone is measured. $A_0$ and $B_0$ are any pair of tuning parameters used to probe the system and $\Delta$ an offset applied to obtain the independent measurements. Using the four measured power figures the optimum values for A and B that minimize the unwanted tone can be found by solving the set of equations:

$$P_0 = ((P_1-P_3)^2 + (P_1-P_2)^2)/(16\, \Delta^2 (P_1-P_4))$$

$$A_{opt} = A_0 + (P_3-P_1)/(4\, \Delta P_0)$$

$$B_{opt} = B_0 + (P_2-P_1)/(4\, \Delta P_0).$$

In other embodiments, the scheme described herein can be extended to any integer harmonics other than the third as shown in FIG. 8.

For example, to cancel the fifth harmonic the following signal should be calculated:

$$S^5 = (I^5 - 10 \cdot I^3 \cdot Q^2 + 5 \cdot I \cdot Q^4) + j(Q^5 - 10 \cdot Q^3 \cdot I^2 + 5 \cdot Q \cdot I^4).$$

Again, the non-linear terms for real and imaginary parts are symmetrical in I and Q and may be approximated with reduced precision. The correction would then be scaled and rotated in the same way as explained for the third order product.

For even order harmonics two distinct calculations should be carried out for real and imaginary parts of the correction signal. For example, the second and forth harmonic of a complex signal are given by $$S^2 = (I^2 - Q^2) + j(2 \cdot I \cdot Q) \text{ and}$$

$$S^4 = (I^4 - 6 \cdot I^2 \cdot Q^2 + Q^4) + j(2 \cdot I^3 \cdot Q - 4 \cdot I \cdot Q^3).$$

To calculate correction terms for these distortion products two distinct non-linear functions have to be evaluated. For example, to cancel a second harmonic $(I^2-Q^2)$ has to be calculated for the real part of the signal and $(2 \cdot I \cdot Q)$ for the imaginary part.

As for the third-order correction calculations, with even order harmonics, symmetries may be exploited to simplify the computational complexity. For example, the function $f(I, Q) = I^2 - Q^2$ has even symmetry for both input parameters $f(-I, Q) = f(+I, Q)$ and $f(I, -Q) = f(I, +Q)$. This would also be reflected in the corresponding look-up table.

For these other cases, the scaling factors A and B would apply in the same manner as for the third order harmonic embodiment as described herein as they represent a combination of gain and phase delay which applies to any harmonic of the signal. This applies equally to LTE or WiMAX systems, or indeed any other modulation scheme.

In other embodiments, a plurality of unwanted harmonic products may be cancelled out by calculating separate correction signals including scaling and phase terms and then superimposing all of the correction signals onto the desired signal.

There is also disclosed a computer readable medium comprising instructions that when executed by a processor cause the processor to carry out the scheme as disclosed herein.

The scheme as disclosed herein allows rejection of unwanted baseband harmonic products that would otherwise cause transmit out-of-band emissions. The scheme is computationally inexpensive because the non-linear calculations are reduced to low precision look-up tables or hard-wired logic thus saving on processor requirement without compromising speed of calculation.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method of reducing unwanted spectral emissions of a complex signal for transmission comprising:
    calculating an nth power of the complex signal for transmission;
    calculating a complex conjugate of the nth power of the complex signal for transmission;
    applying a scaling factor to the complex conjugate to form a scaled correction signal; and
    adding the scaled correction signal to the complex signal for transmission such that unwanted emissions are reduced when the signal is transmitted.

2. The method of claim 1 further comprising applying a phase change to the scaled correction signal.

3. The method according to claim 1 wherein calculating the complex conjugate comprises retrieving a pre-determined value from a lookup table.

4. The method according to claim 3 wherein the lookup table comprises at least two inputs of at least 3-bits and a 4-bit output.

5. The method according to claim 3 wherein the lookup table comprises hard-wired logic arranged to map input bits to output bits.

6. The method according to claim 2 wherein applying the scaling factor and the phase change comprises multiplying the complex conjugate by a vector comprising $A = \alpha \cdot \cos\theta$ and $B = \alpha \cdot \sin\theta$, wherein $\alpha$ is the scaling factor and $\theta$ is the phase change.

7. The method according to claim 6 wherein the complex signal for transmission is an LTE signal and A and B are determined based on an RB start value.

8. The method according to claim 6 wherein A and B are determined based on a quadratic profile of a power of the unwanted spectral emissions.

9. The method according to claim 6 wherein the signal for transmission is a WiMAX signal.

10. The method according to claim 1 further comprising calculating a plurality of complex conjugates, applying a scaling factor to each of the complex conjugates to form a plurality of scaled correction signals, and adding each of the scaled correction signals to the complex signal for transmission.

11. The method according to claim 10 further comprising applying a phase change to at least one of the scaled correction signals.

12. The method according to claim 1 where the complex signal for transmission comprises in-phase and quadrature components.

13. The method according to claim 1 wherein the method is carried out in the digital domain.

14. An apparatus arranged to reduce unwanted spectral emissions of a signal for transmission comprising:
    a first processor block arranged to calculate an nth power of a complex signal for transmission;
    a second processor block arranged to calculate a complex conjugate of the nth power of the complex signal for transmission;

a scaling block arranged to apply a scaling factor to the complex conjugate to form a scaled correction signal; and a summing block arranged to add the scaled correction signal to the complex signal for transmission such that unwanted emissions are reduced when the signal is transmitted.

15. A non-transitory computer readable medium comprising instructions that when executed by a processor causes the processor to carry out the method of claim 1.

16. the method according to claim 7 wherein A and B are determined based on an RB start value and an RB num value.

* * * * *